United States Patent [19]
Takada et al.

[11] Patent Number: 5,914,859
[45] Date of Patent: *Jun. 22, 1999

[54] ELECTRONIC COMPONENT MOUNTING BASE BOARD AND METHOD OF PRODUCING THE SAME

[75] Inventors: Masaru Takada; Kiyotaka Tsukada, both of Ohgaki; Morio Nakao, Hayami-Gun, all of Japan

[73] Assignees: Ibiden Co., Ltd., Ohgaki; Texas Instruments Japan, Ltd., Tokyo, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/837,793

[22] Filed: Apr. 22, 1997

[30] Foreign Application Priority Data

Apr. 29, 1996 [JP] Japan ................................. 8-132751
Mar. 4, 1997 [JP] Japan ................................. 9-067408

[51] Int. Cl.$^6$ ................................................... H05K 7/20
[52] U.S. Cl. ............................ 361/704; 29/831; 174/252; 361/719
[58] Field of Search .................................... 257/706, 707; 174/51, 16.3, 252; 165/80.3, 185; 361/704, 705, 707, 709–712, 717–719; 29/829, 831, 832; 228/180.1, 180.21, 246, 254

[56] References Cited

U.S. PATENT DOCUMENTS

| | | | |
|---|---|---|---|
| 4,535,385 | 8/1985 | August | 361/688 |
| 4,598,308 | 7/1986 | James | 357/81 |
| 5,088,639 | 2/1992 | Gondotra et al. . | |
| 5,394,298 | 2/1995 | Sagisaka | 361/704 |
| 5,410,451 | 4/1995 | Hawthorne | 29/832 |
| 5,431,332 | 7/1995 | Kirby et al. . | |
| 5,432,677 | 7/1995 | Mowatt | 361/719 |
| 5,546,275 | 8/1996 | Moutrie | 361/707 |

FOREIGN PATENT DOCUMENTS

A-6-97331  6/1994  Japan .

*Primary Examiner*—Gerald Tolin
*Attorney, Agent, or Firm*—Oliff & Berridge, PLC

[57] ABSTRACT

An electronic component mounting base board comprises an insulating substrate provided with a mounting portion for mounting an electronic component and a heat-sink plate disposed on an lower surface of the insulating substrate, in which the insulating substrate is provided with a wiring pattern for signal or power, a grounding pattern and a grounding hole, and the grounding hole is provided on its inner wall with a metal plated film for electrically connecting to the grounding pattern and a solder is filled in an inside of the grounding hole for electrically connecting to the heat-sink plate.

12 Claims, 10 Drawing Sheets

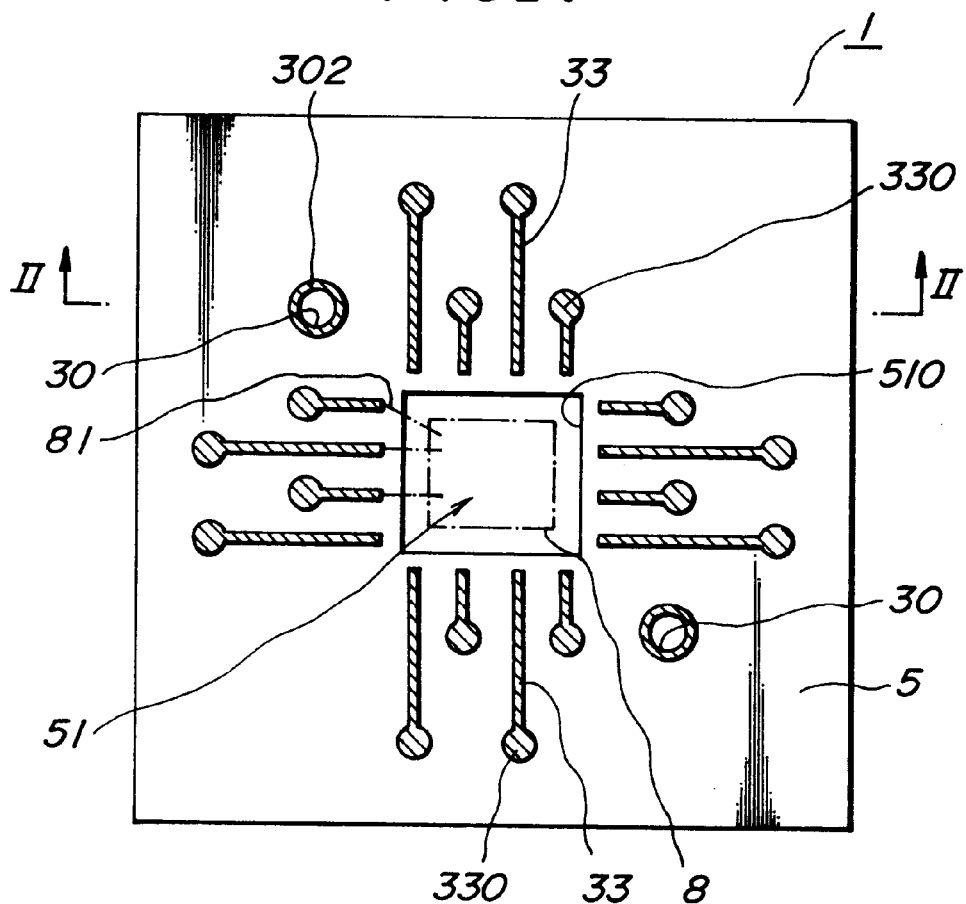
FIG_1
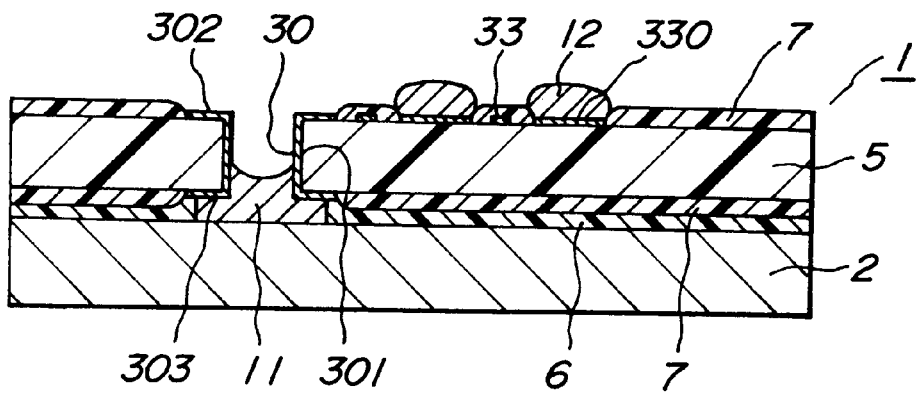
FIG_2

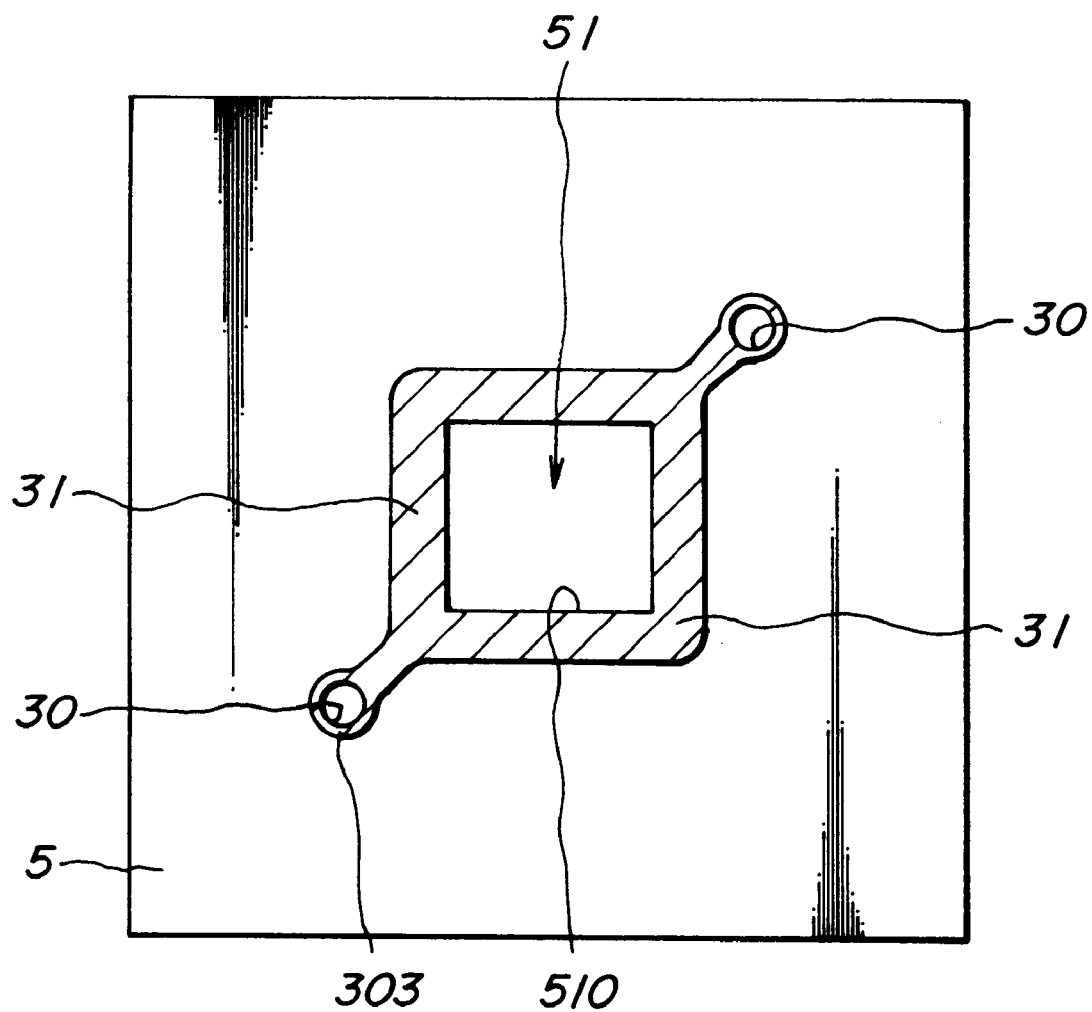
FIG_3

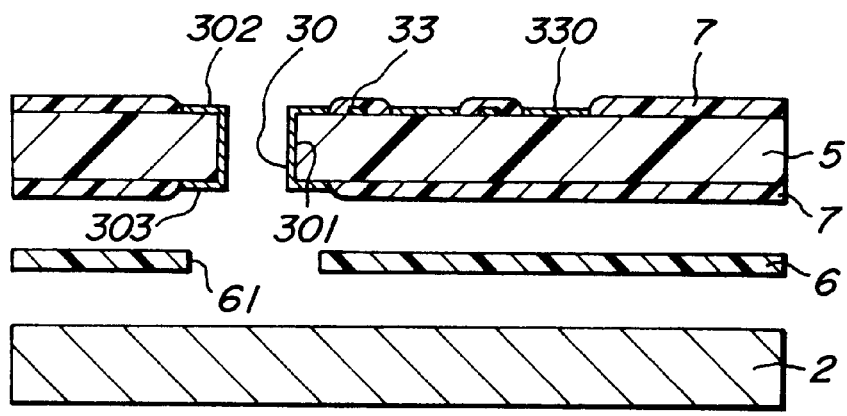
FIG_4
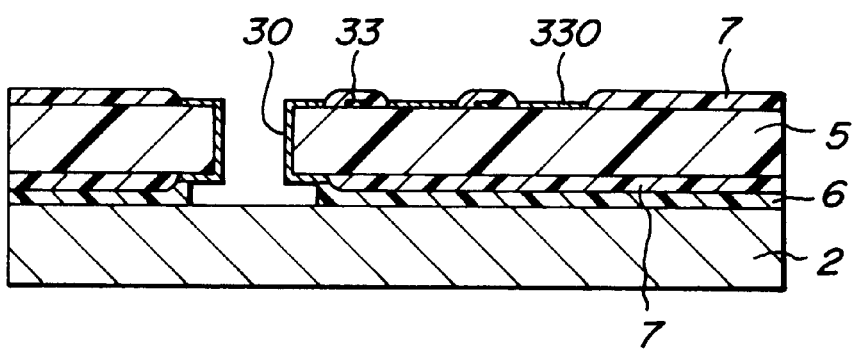
FIG_5
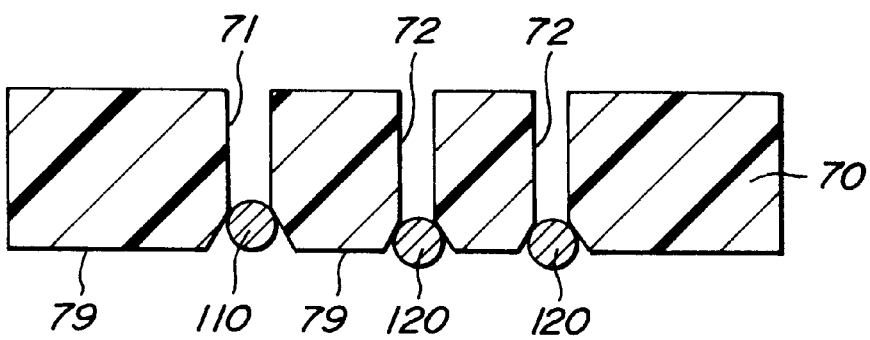
FIG_6

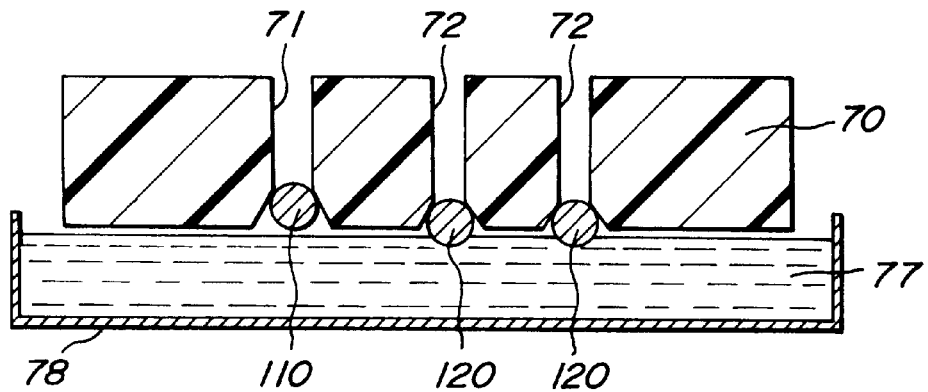
FIG_7
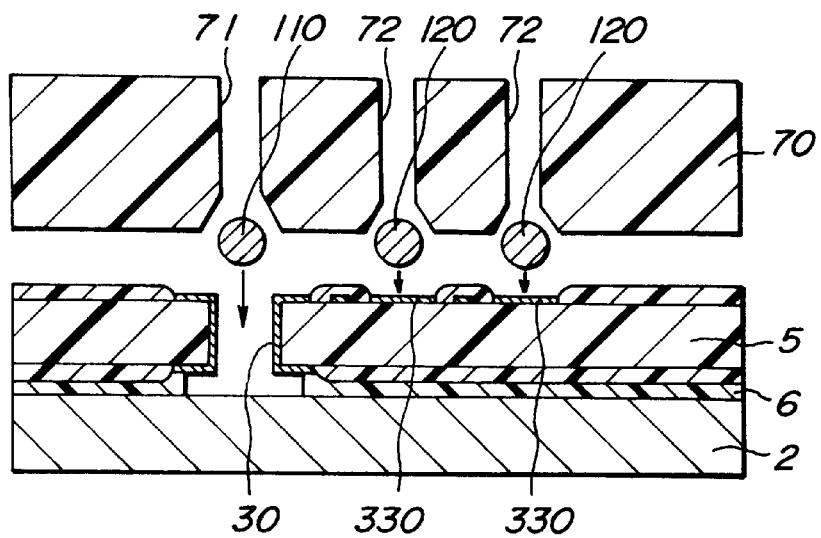
FIG_8
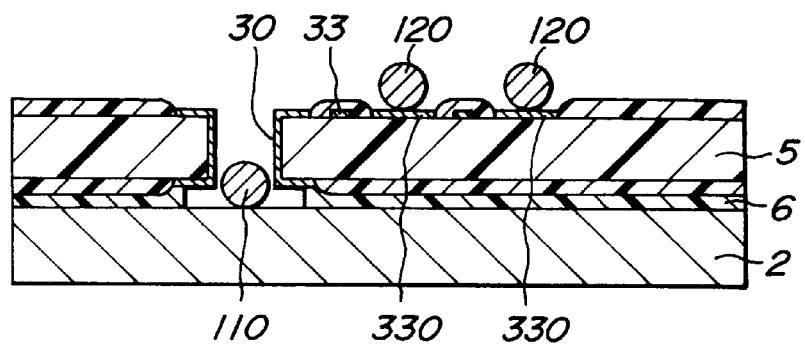
FIG_9

FIG_13
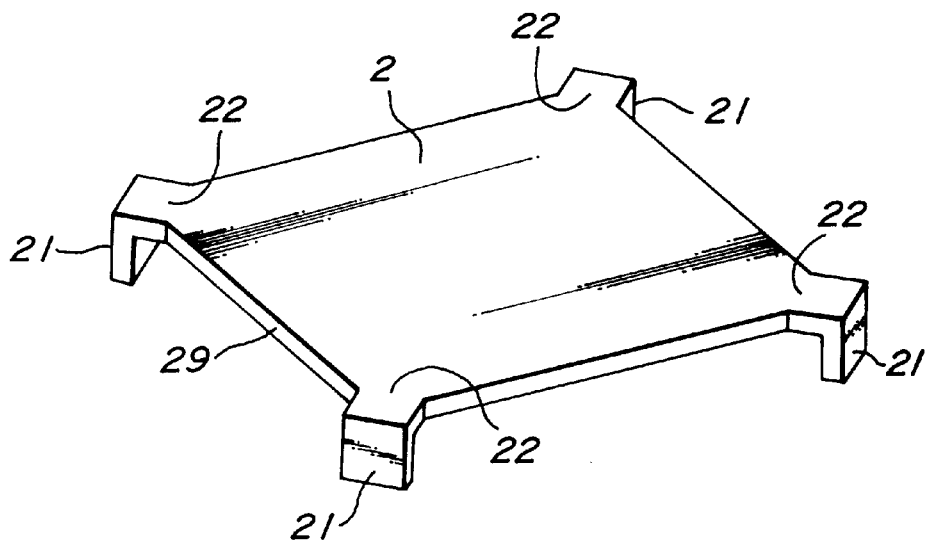
FIG_14
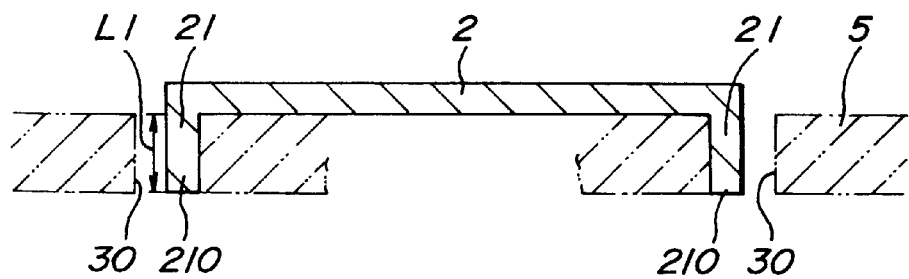
FIG_15
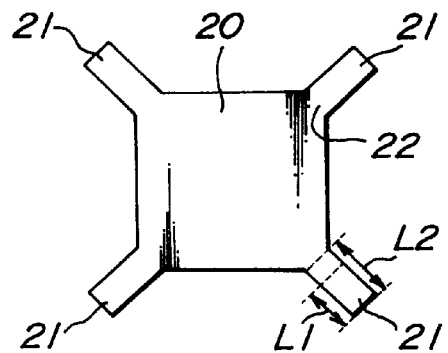

FIG_18
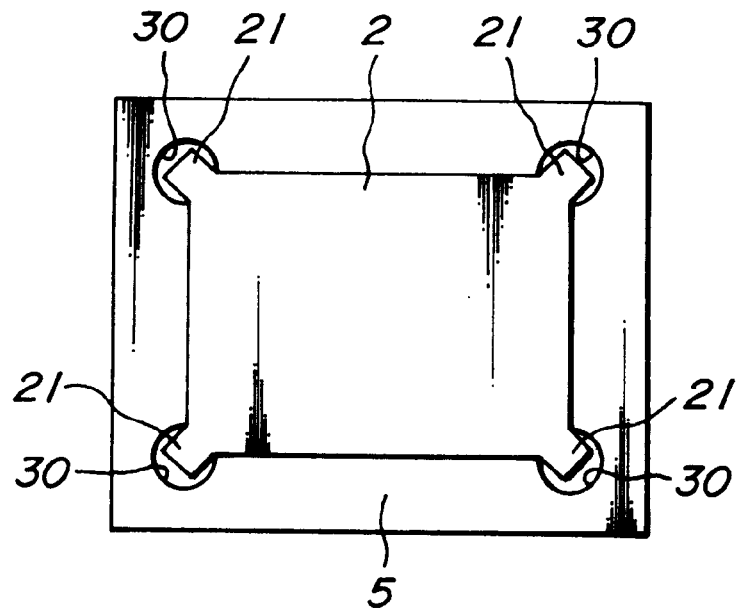
FIG_19
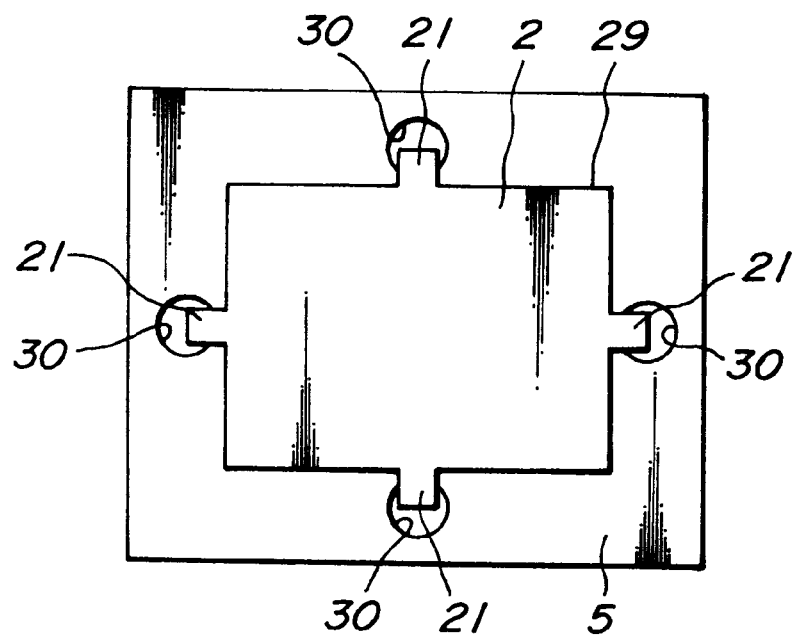

ic component mounting base board and a method of producing the same, and more particularly to a structure for electrically connecting a grounding pattern to a heat-sink plate.

2. Description of Related Art

As an electronic component mounting base board, there has hitherto been known a base board in which a dented mounting portion 97 for mounting an electronic component 98 is formed in an insulating substrate 99 and a wiring pattern 93 and a grounding pattern 91 are disposed on an upper surface and a lower surface thereof as shown in FIG. 20.

The wiring pattern 93 is electrically connected to the electronic component 98 through a bonding wire 982. A ball-shaped solder 92 for joining an electronic component mounting base board 9 to another member is joined to the wiring pattern 93.

Furthermore, a heat-sink plate 96 is bonded to the lower surface of the insulating substrate 99 through a conductive adhesion member 95 consisting essentially of silver as shown in FIG. 22. The grounding pattern 91 disposed on the lower surface of the insulating substrate 99 is broadly formed so as to surround a circumference of the mounting portion 97 as shown in FIG. 21.

As shown in FIG. 20, the grounding pattern 91 is electrically connected to the heat-sink plate 96 through the above conductive adhesion member 95.

The wiring pattern 93 and the grounding pattern 91 disposed on the upper and lower surfaces of the insulating substrate 99 are electrically connected to each other through an annular circuit 971 arranged on an inner wall of the dented mounting portion 97. Therefore, a current flowed into the grounding pattern 91 is transferred to the heat-sink plate 96 through the conductive adhesion member 95.

Moreover, a through-hole 991 may be formed instead of the annular circuit to provide electrical continuity between the wiring pattern 93 and the grounding pattern 91.

In the conventional electronic component mounting base board, however, the conductive adhesion member 95 consists essentially of silver, so that the cost becomes high. Further, the adhesion area is restricted, so that the scattering of resistance value in the conductive adhesion member 95 becomes large. Moreover, the heat-sink plate 96 is adhered to the metal face of the grounding pattern 91 through the adhesion member 95, so that the adhesion strength is weak.

In the production of such an electronic component mounting base board, as shown in FIG. 23, end faces of the insulating substrate 99 and the heat-sink plate 96 are contacted onto a positioning guide 960 to position the insulating substrate 99 and the heat-sink plate 96 and then the adhesion member 95 is cured.

When the thickness of the heat-sink plate 96 is as very thin as 0.1–1.0 mm, however, it is difficult to contact the end face 969 of the heat-sink plate 96 onto the positioning guide 960 and hence the positioning may not be conducted. Further, when the heat-sink plate 96 is adhered through the adhesion member 95 to the insulating substrate 99, the adhesion member 95 is overflowed between the plate 96 and the substrate 99 to adhere to the positioning guide 960 and there is caused a fear of complicating the positioning operation.

As shown in FIG. 20, the electronic component 98 may directly be connected to the heat-sink plate 96 located in the bottom of the mounting portion 97 through a bonding wire 981 to ground the electronic component 98. However, the bottom of the mounting portion 97 is narrow and is dented, so that the joining operation of the bonding wire 981 becomes complicated.

SUMMARY OF THE INVENTION

It is, therefore, an object of the invention to solve the aforementioned drawbacks of the conventional technique and to provide an electronic component mounting base board being low in the cost and capable of controlling the scattering of adhesion strength and the scattering of resistance value between the insulating substrate and the heat-sink plate and a method of producing the same.

According to a first aspect of the invention, there is the provision of an electronic component mounting base board comprising an insulating substrate provided with a mounting portion for mounting an electronic component and a heat-sink plate disposed on an lower surface of the insulating substrate, characterized in that the insulating substrate is provided with a wiring pattern for signal or power, a grounding pattern and a grounding hole, and that the grounding hole is provided on its inner wall with a metal plated film for electrically connecting to the grounding pattern and a solder is filled in an inside of the grounding hole for electrically connecting to the heat-sink plate.

In the electronic component mounting base board according to the invention, the inside of the grounding hole is filled with the solder to electrically connect to the heat-sink plate located in the bottom of the grounding hole. The solder is low in the cost as compared with the conductive adhesion member consisting essentially of silver. And also, the grounding hole is electrically connected to the heat-sink plate through the solder, so that it is not required to adhere the insulating substrate to the heat-sink plate through the conductive adhesion member consisting essentially of silver and having a high cost. Consequently, the production cost can be reduced.

Furthermore, it is not required to expose a metal pattern on the adhesion surface of the insulating substrate because the grounding hole is electrically connected to the heat-sink plate through the solder. As a result, the adhesion area between the heat-sink plate and the insulating substrate is increased to improve the adhesion strength.

Moreover, the control of the hole size in the ground hole can easily be carried out by a piercing device or the like, so that the control of joint area between the solder and the heat-sink plate can accurately be carried out. As a result, the scattering of resistance value can be controlled.

In a preferable embodiment, a projection piece extending from the end face of the heat-sink plate and folding therefrom is inserted into the inside of the grounding hole and fixed thereto through the solder. Thus, the soldering strength between the metal plated film covering the inner wall of the grounding hole and the heat-sink plate is increased.

Further, the positioning between the heat-sink plate and the insulating substrate can accurately be carried out by inserting the projection piece into the inside of the grounding hole. For this end, the positioning guide is useless and hence the positioning of the heat-sink plate can easily be carried out. Moreover, if the heat-sink plate is temporarily adhered to the insulating substrate through an adhesion member such as an adhesion sheet or the like, there is caused no inconvenience of adhering the fused adhesion member to the positioning guide.

Consequently, the quality and productivity of the electronic component mounting base board are improved and also the simplification of production steps and reduction of cost can be realized.

By fixing the projection piece of the heat-sink plate to the inside of the grounding hole through the solder, the joint area of the grounding hole is increased to increase the adhesion strength between the heat-sink plate and the insulating substrate. As a result, the mechanical strength of the electronic component mounting base board is improved. And also, the electrical connection reliability between the heat-sink plate and the grounding hole is improved and the resistance value can be controlled to a low level and the scattering is less. Moreover, the projection piece serves as a way of escaping heat generated from the electronic component to improve heat-dissipating effect.

In another preferable embodiment, an even number of projection pieces are formed in the end face of the heat-sink plate. Thus, the positioning operation of the heat-sink plate becomes more easy and the connection reliability of the heat-sink plate is more improved.

In the other preferable embodiment, the projection pieces are symmetrically arranged with respect to a center of the heat-sink plate. Thus, the connection reliability of the heat-sink plate can be obtained well-balancedly.

In a further preferable embodiment, the projection piece is arranged in a position most apart from the central position of the heat-sink plate. Thus, the connection reliability of the heat-sink plate as a whole can be ensured.

In a still further preferable embodiment, a length of the projection piece to be inserted into the inside of the ground hole is within a range of 50–100% of the depth of the grounding hole. Thus, the projection piece is surely engaged with the inner wall of the grounding hole, whereby the positioning of the heat-sink plate can easily be carried out. And also, the joint area between the projection piece and the solder becomes large to more improve the joint strength of the heat-sink plate.

On the other hand, when the inserting length of the projection piece into the grounding hole is less than 50% of the depth of the grounding hole, there is caused a fear of decreasing the joint strength of the heat-sink plate. While, when a top of the projection piece protrudes from the grounding hole, there is a fear that the top of the projection piece obstructs the surface packaging of the electronic component mounting base board.

In the other preferable embodiment, the inserting portion of the projection piece into the inside of the grounding hole is joined over 50–100% of a full surface of the inserting portion to the solder filled in the inside of the grounding hole. Thus, the joint area between the projection piece and the solder becomes large and the joint strength of the heat-sink plate is more improved. And also, the resistance value in the grounding hole can be controlled to a lower level. When the joint area of the inserting portion is less than 50%, there is a fear of lowering the joint strength between the projection piece and the solder.

In a further preferable embodiment, the projection piece has a thickness of 0.1–0.5 mm. Thus, the strength of the projection piece can be held at a higher level and hence the connection reliability of the heat-sink plate to the insulating substrate becomes higher. And also, the folding work of the projection piece is easy. Furthermore, the projection piece can be inserted into a small-size grounding hole, so that a high density packaging of the grounding holes can be realized. Moreover, if the thickness of the heat-sink plate is thicker than the thickness of the projection piece, a portion of the heat-sink plate corresponding to the projection piece may previously be thinned to a given value within the above thickness range by pressing or etching.

In a still further preferable embodiment, the heat-sink plate has a thickness of 0.1–1.0 mm. Thus, the thinning of the electronic component mounting base board can be realized while maintaining the sufficient heat dissipating property. When the thickness of the heat-sink plate is less than 0.1 mm, there is a fear of lowering the strength of the heat-sink plate, while when it exceeds 1.0 mm, the electronic component mounting base board becomes thicker and also the weight thereof becomes heavier.

Moreover, the material of the heat-sink plate is favorable to be a metallic material such as copper, aluminum, nickel, iron or the like or an alloy thereof. Among them, copper and aluminum are favorable. The metallic material may be a single substance, but it is preferable to be subjected to a surface treatment such as surface coating through plating of Ni, Ni-Au, tin, solder or the like, a redox treatment (i.e. reduction-oxidation treatment) or the like. In the latter case, the effect of realizing higher strength through the fusion of the solder can be expected.

According to a second aspect of the invention, there is the provision of a method of producing an electronic component mounting base board provided with a grounding pattern, which comprises forming a mounting portion for mounting an electronic component, a wiring pattern for signal or power, a grounding pattern and a grounding hole covered at its inner wall with a metal plated film on an insulating substrate, and adhering a heat-sink plate to a lower surface of the insulating substrate through an adhesion layer having an opening at a position corresponding to the grounding hole, and feeding a solder to an inside of the grounding hole, and fusing the solder by heating to join the metal plated film formed in the inner wall of the grounding hole to the heat-sink plate.

In the method according to the invention, the grounding hole is electrically connected to the heat-sink plate through the solder, so that it is not required to expose the metal pattern to the adhesion surface of the insulating substrate. Therefore, the adhesion area between the heat-sink plate and the insulating substrate is increased to improve the adhesion strength. Furthermore, the production cost can be reduced because the solder being relatively low in the cost is used instead of a conductive adhesion member consisting essentially of silver being high in the cost.

In a preferable embodiment, a solder is simultaneously fed to the wiring pattern for signal or power in the feeding of the solder to the inside of the grounding hole. Thus, the labor of feeding the solder to the grounding hole and the wiring pattern for signal or power can be mitigated.

In another preferable embodiment, a projection piece extending from the end face of the heat-sink plate and folding therefrom is inserted into the inside of the grounding hole after the formation of the grounding hole and before the adhesion of the heat-sink plate to the lower surface of the insulating substrate. Thus, the soldering strength between the metal plated film covering the inner wall of the grounding hole and the heat-sink plate is increased. As a result, the quality reliability and heat dissipation of the electronic component mounting base board are improved.

Further, the positioning between the heat-sink plate and the insulating substrate can be carried out by inserting the projection piece into the inside of the grounding hole, so that the positioning guide is useless. And also, the positioning of the heat-sink plate can accurately and easily be carried out. Moreover, if the heat-sink plate is temporarily adhered to the insulating substrate through an adhesion member such as an adhesion sheet or the like, there is caused no inconvenience of adhering the adhesion member to the positioning guide.

In the other preferable embodiment, a method of dropping a solder ball into the inside of the grounding hole is used in the feeding of the solder to the inside of the grounding hole. Since the volume of the solder ball is controlled to a certain value, the feeding amount of the solder to the grounding hole may be constant. Further, the size of the grounding hole can accurately be controlled by a piercing device or the like. Therefore, the contact area between the grounding hole and the heat-sink plate can be made constant and the scattering of resistance value therebetween can be controlled.

In a further preferable embodiment, a method of printing a solder paste is used in the feeding of the solder to the inside of the grounding hole. Thus, the solder can easily be fed to the inside of the grounding hole.

BRIEF DESCRIPTION OF THE DRAWINGS

The invention will be described with reference to the accompanying drawings, wherein:

FIG. 1 is a plan view of a first embodiment of the electronic component mounting base board according to the invention;

FIG. 2 is a diagrammatic section view taken along a line II—II of FIG. 1;

FIG. 3 is a rear view of an insulating substrate used in the first embodiment;

FIG. 4 is a diagrammatic view illustrating a lamination state of an insulating substrate, an adhesion sheet and a heat-sink plate in the first embodiment;

FIG. 5 is a diagrammatic section view of the insulating substrate adhered to the heat-sink plate in the first embodiment;

FIG. 6 is a diagrammatic view of a jig holding solder balls through suction in the first embodiment;

FIG. 7 is a diagrammatic view illustrating a method of adhering a flux to the solder balls in the first embodiment;

FIG. 8 is a diagrammatic view illustrating a method of feeding the solder balls to an inside of a grounding hole and a wiring pattern in the first embodiment;

FIG. 9 is a diagrammatic section view of the insulating substrate illustrating a state of arranging the solder balls in the inside of the grounding hole and onto the wiring pattern in the first embodiment;

FIG. 13 is a perspective view of the heat-sink plate used in the second embodiment;

FIG. 14 is a diagrammatic section view illustrating a state of inserting a projection piece of the heat-sink plate in the second embodiment;

FIG. 15 is a plan view of the heat-sink plate illustrating a folding position of projection pieces in the second embodiment;

FIG. 18 is a plan view of the second embodiment provided with a rectangular heat-sink plate;

FIG. 19 is a plan view of a third embodiment of the electronic component mounting base board according to the invention illustrating a position relation between an insulating substrate and a heat-sink plate;

DESCRIPTION OF THE PREFERRED EMBODIMENTS

Figure 10:
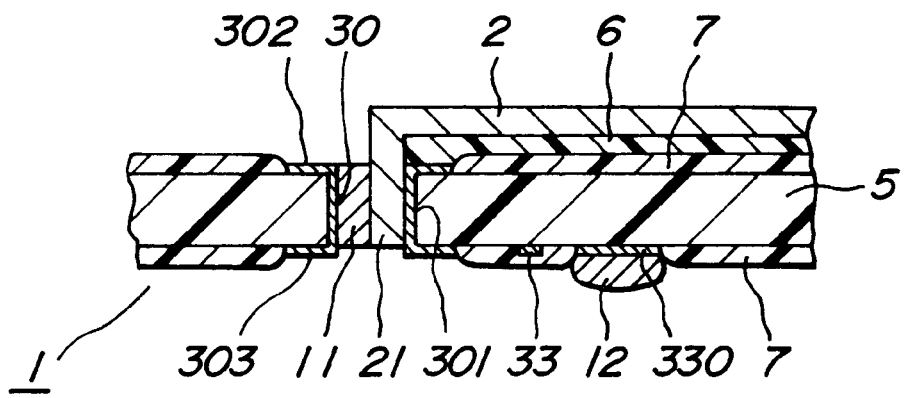
FIG. 10 is a partially diagrammatic section view of a second embodiment of the electronic component mounting base board according to the invention.

A first embodiment of the electronic component mounting base board according to the invention will be described with reference to FIGS. 1–9 below.

As shown in FIGS. 1 and 2, an electronic component mounting base board 1 in the first embodiment of the invention comprises an insulating substrate 5 provided with a mounting portion 51 for mounting an electronic component 8 and a heat-sink plate 2 adhered to a lower surface of the insulating substrate 5.

The insulating substrate 5 has a grounding hole 30 for connecting to a grounding pattern 31.

The grounding hole 30 is covered at its inner wall with a metal plated film 301. A solder 11 is filled in the inside of the grounding hole 30 so as to electrically connect to the heat-sink plate 2.

Lands 302 and 303 are disposed on an upper opening portion and a lower opening portion of the grounding hole 30, respectively.

On the lower surface of the insulating substrate 5 is arranged a grounding pattern 31 surrounding the mounting portion 51 as shown in FIG. 3. Further, wiring patterns 33 for signal or power are arranged around the mounting portion 51 as shown in FIGS. 1 and 2. A ball-shaped solder 12 is joined onto a pad portion 330 of the wiring pattern 33.

The upper surface and lower surface of the insulating substrate 5 are covered with solder resist films 7, respectively.

The insulating substrate 5 and the heat-sink plate 2 have the same size and are adhered to each other through an insulating adhesion sheet 6.

The production method of the electronic component mounting base board in the first embodiment will be described below.

At first, an outline of this method is described. As shown in FIGS. 3 and 4, a mounting hole 510 for the formation of the mounting portion, the grounding pattern 31 and the grounding hole 30 covered at its inner wall with the metal plated film 301 are formed in the insulating substrate 5. Then, the heat-sink plate 2 is adhered to the lower surface of the insulating substrate 5 through the adhesion sheet 6 having an opening 61 at a position corresponding to the grounding hole 30 as shown in FIG. 5. As shown in FIGS. 6–9, a solder ball 110 is fed to the inside of the grounding hole 30 and fused by heating to join the metal plated film 301 in the inner wall of the grounding hole 30 to the heat-sink plate 2.

The details of such a production method will be described below.

As shown in FIGS. 3 and 4, the mounting hole 510 for the formation of the mounting portion and the grounding hole 30 are firstly formed in the insulating substrate 5 by a piercing device such as drill or the like. As the insulating substrate 5 is used a glass epoxy substrate.

Then, the metal plated film 301 is formed on the inner wall of the grounding hole 30 and the wiring pattern 33 and a land 302 for the grounding hole 30 are formed on the upper surface of the insulating substrate 5 by usual manner such as plating, light exposure, etching or the like. Furthermore, the grounding pattern 31 surrounding the mounting hole 510 and a land 303 for the grounding hole 30 are formed on the lower surface of the insulating substrate 5.

Next, the upper surface and lower surface of the insulating substrate 5 are covered with solder resist films 7, in which circumferences of the grounding hole 30 and the mounting hole 510 and a pad portion 330 of the wiring pattern are exposed from the solder resist film 7.

Separately, a prepreg is provided as an adhesion sheet 6. Then, openings 61 are formed in the adhesion sheet 6 at positions corresponding to the grounding hole 30 and the mounting hole 510, respectively. Thereafter, the insulating substrate 5 is piled on an upper surface of the heat-sink plate 2 through the adhesion sheet 6 and pressed under heating. Thus, the heat-sink plate 2 is adhered to the lower surface of the insulating substrate 5 through the adhesion sheet 6 as shown in FIG. 5.

On the other hand, a jig 70 for the feeding of solder balls is provided as shown in FIG. 6. This jig 70 is provided with suction holes 71, 72 holding solder balls 110, 120 under suction. In this case, the solder ball 110 is to be fed to the inside of the grounding hole, while the solder ball 120 is to be fed onto the pad portion of the wiring pattern. The solder balls 110, 120 have a melting point of 185° C.

Moreover, the solder ball 110 is held by the suction hole 71 so as to locate inward from a lower surface 79 of the jig 70, while the solder ball 120 is held by the suction hole 72 at a state of slightly protruding from the lower surface 79 of the jig 70.

As shown in FIG. 7, the jig 70 holding the solder balls 110, 120 is placed above a container 78 filled with a flux 77 and descended downward to immerse the bottoms of the solder balls 120 slightly protruded from the jig 70 in the flux 77. Thus, the flux 77 is adhered to the bottoms of the solder balls 120.

Then, the jig 70 is placed above the insulating substrate 5 so as to match the positions of the suction holes with the positions of the grounding hole and the pad portion and thereafter the suction force in the suction holes 71, 72 is weakened to drop downward the solder balls 110, 120 from the suction holes 71, 72. As a result, the solder ball 110 is fed to the inside of the grounding hole 30 and the solder ball 120 is fed onto the surface of the pad portion 330 of the wiring pattern 33 as shown in FIG. 9.

Thereafter, the insulating substrate is placed in a heating furnace to heat the solder balls 110, 120. In this case, the heating conditions are 220–230° C. and 50–60 seconds. As a result, the solder ball 110 fed to the inside of the grounding hole 30 is fused and the grounding hole 30 is joined to the heat-sink plate 2 through the fused solder 11 as shown in FIG. 2, while the solder ball 120 fed onto the pad portion 330 is fused and joined to the pad portion 330 in form of a ball-shaped solder 12.

As shown in FIG. 1, the electronic component 8 is placed in the mounting portion 51 and connected to the wiring patterns 33 through bonding wires 81, whereby the electronic component mounting base board is obtained.

Although the mounting of the electronic component 8 on the mounting portion 51 is carried out after the fusion of the solder balls in the illustrated embodiment, it may be carried out before the feeding of the solder balls.

The action and effect of the first embodiment will be described below.

In the electronic component mounting base board of the first embodiment, the solder 11 is filled in the inside of the grounding hole 30 and electrically connected to the heat-sink plate 2 located at the bottom surface thereof. The solder 11 is low in the cost as compared with the conductive adhesion member consisting essentially of silver. Furthermore, it is not required to adhere the insulating substrate 5 to the heat-sink plate 2 through the conductive adhesion member consisting essentially of high-cost silver, so that the production cost can be reduced.

Since the size of the grounding hole 30 can easily be controlled by the piercing device or the like, the control of the joint area between the solder 11 and the heat-sink plate 2 can accurately be conducted and hence the scattering of resistance value can be restrained.

Furthermore, the grounding hole 30 is electrically connected to the heat-sink plate 2 through the solder 11, so that it is not required to expose the grounding pattern 31 to the adhesion face of the insulating substrate 5. As a result, the adhesion area between the heat-sink plate 2 and the insulating substrate 5 is increased to improve the adhesion strength.

As shown in FIG. 9, the filling of the solder 11 in the grounding hole 30 is carried out by using the solder ball 110. Since the volume of the solder ball is controlled to a certain level, the feeding amount of the solder to the inside of the grounding hole 30 can be made constant. Therefore, the contact area between the grounding hole 30 and the heat-sink plate 2 can be made constant and hence the scattering of resistance value therebetween can be controlled.

As shown in FIG. 8, the solder ball 120 is simultaneously fed to the pad portion 330 of the wiring pattern in the feeding of the solder ball 110 to the inside of the grounding hole 30. As a result, the labor of feeding the solder balls 110, 120 to the inside of the grounding hole 30 and onto the pad portion 330 can be mitigated. Furthermore, the amount of the flux adhered to the solder ball 110 may be made very less, so that the effect of omitting the labor and time such as washing of flux and the like can be obtained.

A second embodiment of the electronic component compounding base board according to the invention will be described below.

In the electronic component mounting base board of this embodiment, a projection piece 21 extending from an end face of the heat-sink plate 2 and folding therefrom either upwardly or downwardly in a vertical direction is inserted into the inside of the grounding hole 30 as shown in FIGS. 10–14. The projection piece 21 is joined and fixed by the solder 11 filled in the inside of the grounding hole 30.

Figure 11:
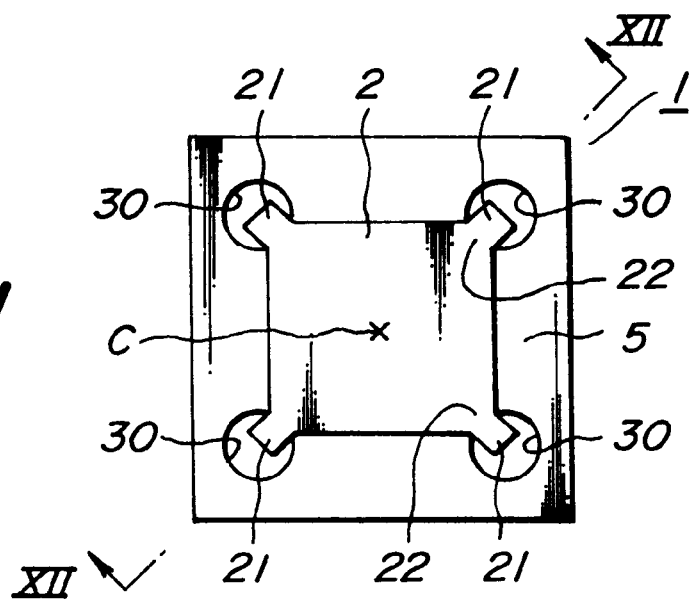
FIG. 11 is a plan view of the second embodiment.
Figure 12:
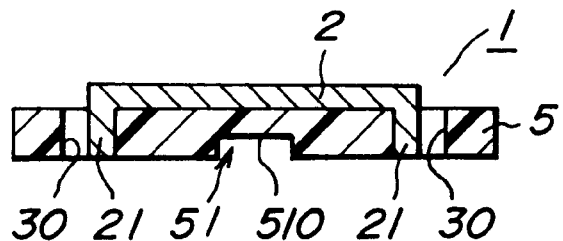
FIG. 12 is a diagrammatic section view illustrating a position relation between an insulating substrate and a heat-sink plate in the second embodiment taken along a line XII—XII of FIG. 11.

As shown in FIGS. 11 to 13, four projection pieces 21 are formed on the end face 29 of the heat-sink plate 2 and symmetrically arranged with respect to a center C of the heat-sink plate 2. That is, each of the projection pieces 21 is arranged in a corner region 22 of the heat-sink plate 2 located most apart from the center C thereof.

As shown in FIG. 14, a length L1 of an inserting portion 210 of the projection piece 21 into the inside of the grounding hole 30 is the same as a depth of the grounding hole 30. As shown in FIG. 10, the full surface of the inserting portion 210 is joined with the solder 11 filled in the inside of the grounding hole 30.

The projection piece 21 has a thickness of 0.25 mm. The grounding hole 30 has a diameter of 1.0 mm. The heat-sink plate 2 is an oxygen-free copper plate provided with a Ni plated film of 5 μm and has a size of 25 mm×25 mm×0.25 mm.

In the fixation of the heat-sink plate to the insulating substrate, as shown in FIG. 15, a metal plate 20 is first subjected to an outer profile work by means of a blanking die to form a projection piece 21 extending from each corner portion 22 of the square metal plate. A length L2 of the projection piece 21 is 0.6 mm.

Then, the projection piece 21 is folded by a bending device at a position corresponding to a length L1 of an inserting portion 210 from a top of the projection piece 21.

On the other hand, a grounding hole 30, a mounting hole 510, a grounding pattern 31, a wiring pattern 33, and lands 302, 303 are formed in the insulating substrate 5 likewise the first embodiment, which are covered with solder resist films 7. Further, a one-side surface of the insulating substrate 5 is covered with an adhesion sheet 6. The adhesion sheet 6 is an insulating prepreg formed by impregnating a glass cloth with a thermosetting resin (e.g. epoxy resin or the like).

Next, the heat-sink plate 2 is placed on the surface of the insulating substrate 5 through the adhesion sheet 6. In this case, the projection piece 21 of the heat-sink plate 2 is inserted into the inside of the grounding hole 30 to conduct the positioning of the heat-sink plate 2 to the insulating substrate 5.

Thereafter, the adhesion sheet 6 is thermally cured to adhere the heat-sink plate 2 to the insulating substrate 5.

Then, a solder ball is fed to the inside of the grounding hole 30 likewise the first embodiment (see FIGS. 6–9) and fused by heating to join and fix the projection piece 21 to the grounding hole 30 through a solder 11. Thus, the heat-sink plate 2 is fixed to the surface of the insulating substrate 5.

Moreover, a ball-shaped solder 12 is joined onto the surface of the pad portion 330 of the wiring pattern 33.

The other structure is the same as in the first embodiment.

The function and effect of the second embodiment will be described below.

In the electronic component mounting base board 1 of the second embodiment, as shown in FIG. 10, the projection piece 21 of the heat-sink plate 2 is inserted into the inside of the grounding hole 30. Therefore, the soldering strength between the heat-sink plate 2 and the metal plated film 301 covering the inner wall of the grounding hole 30 becomes higher.

Further, the positioning between the heat-sink plate 2 and the insulating substrate 5 can accurately be carried out by inserting the projection piece 21 into the inside of the grounding hole 30. As a result, the positioning guide is useless and hence the positioning of the heat-sink plate 2 can easily be conducted.

And also, when the heat-sink plate 2 is temporarily adhered to the insulating substrate 5 through the adhesion sheet 6, there is not caused an inconvenience that the fused adhesion sheet 6 adheres to the positioning guide.

Moreover, the projection piece 21 of the heat-sink plate 2 is fixed to the inside of the grounding hole 30 through the solder 11, so that the joint area of the heat-sink plate 2 is increased to increase the adhesion strength of the heat-sink plate 2 to the insulating substrate 5. As a result, the electrical connection reliability between the heat-sink plate 2 and the grounding hole 30 and the mechanical strength of the electronic component mounting base board are improved.

Figure 16:
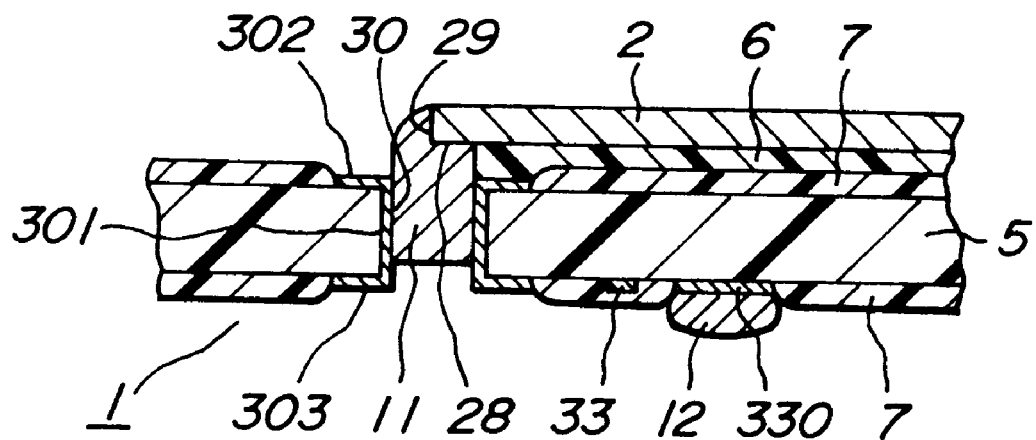
FIG. 16 is a partially diagrammatic section view of an electronic component mounting base board as a comparative example showing a problem produced when the projection piece is not formed in the heat-sink plate.

A large connection area to the insulating substrate 5 can be ensured by fixing the projection piece 21 through the solder 11 as compared with a case of fixing a plan face 28 or end face 29 of the heat-sink plate 2 through the solder 11 as shown in FIG. 16, and hence the mechanical connection reliability is high.

Furthermore, the projection piece 21 serves as a way of escaping heat generated from the electronic component to improve heat-dissipating effect.

Figure 17:
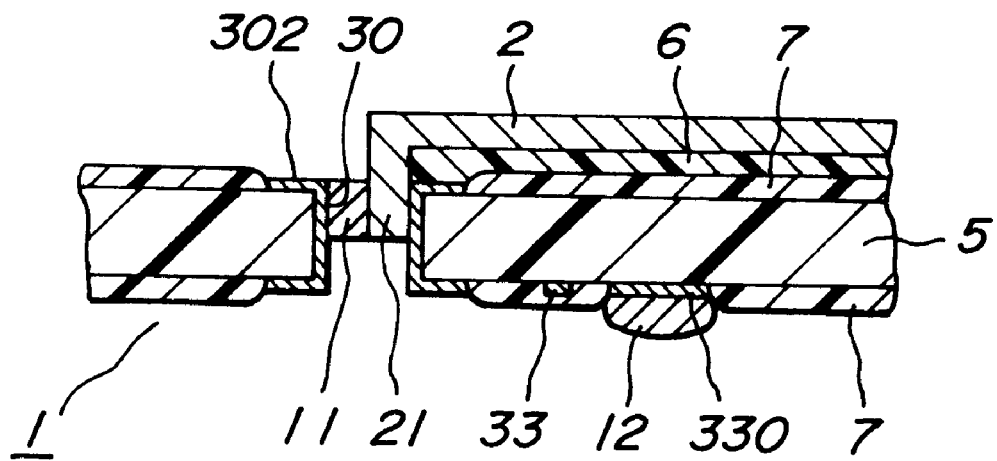
FIG. 17 is a partially diagrammatic section view of the second embodiment when an inserting length of the projection piece in the heat-sink plate is 50% of the depth of the grounding hole.
Figure 20:
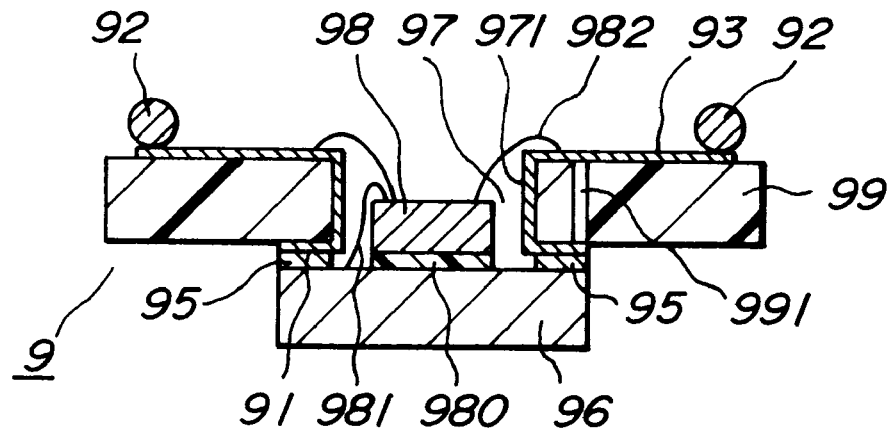
FIG. 20 is a diagrammatic section view of the conventional electronic component mounting base board.
Figure 21:
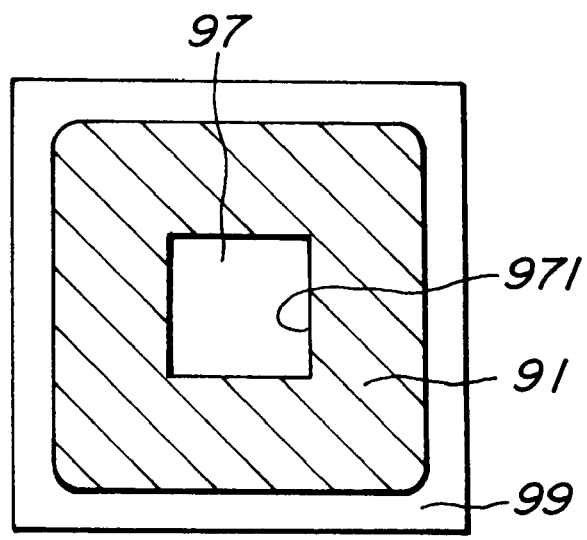
FIG. 21 is a rear view of an insulating substrate in the conventional example.
Figure 22:
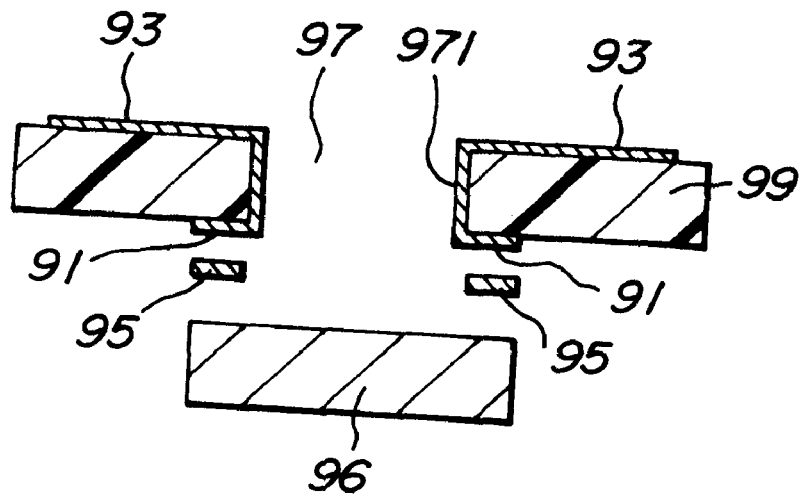
FIG. 22 is an exploded diagrammatic view of the conventional example.
Figure 23:
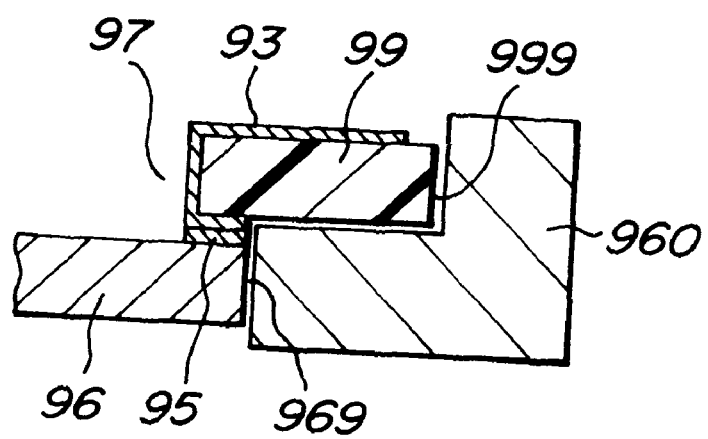
FIG. 23 is a diagrammatic view illustrating a method of positioning a heat-sink plate and an insulating substrate in the conventional example.

Although the length L1 of the inserting portion 210 of the projection piece 21 into the inside of the grounding hole 30 is the same as the depth of the grounding hole 30 in the second embodiment, even when it is about 50% of the depth of the grounding hole 30 as shown in FIG. 17, the projection piece 21 can be soldered to the inner wall of the grounding hole 30 at a sufficient strength.

As shown in FIG. 18, the heat-sink plate 2 may be rectangular.

A third embodiment of the electronic component mounting base board according to the invention will be described below.

In the electronic component mounting base board 1 of the third embodiment, the projection piece 21 is formed in a middle of each side of the end face 29 of the heat-sink plate 2 as shown in FIG. 19. In this case, the heat-sink plate 2 has a rectangular shape of 25 mm×30 mm.

The other structure is the same as in the second embodiment.

The effect similar to that of the second embodiment can be obtained even in the third embodiment.

As mentioned above, according to the invention, there can be provided an electronic component mounting base board being low in the cost and capable of controlling the scattering of adhesion strength between the insulating substrate and the heat-sink plate and the scattering of resistance value as well as a method of producing the same.

What is claimed is:

1. An electronic component mounting base board, comprising:

an insulating substrate provided with a mounting portion for mounting an electronic component and a heat-sink plate disposed on a lower surface of the insulating substrate, wherein the insulating substrate is provided with a wiring pattern for signal or power, a grounding pattern and a grounding hole, the grounding pattern surrounds the mounting portion, the grounding hole is provided on its inner wall with a metal plated film electrically connecting to the grounding pattern and a solder is filled in an inside of the grounding hole and electrically connects the plated film to the heat-sink plate and a projection piece extending from the end face of the heat-sink plate and folding therefrom is inserted into the inside of the grounding hole and fixed thereto through the solder.

2. An electronic component mounting base board according to claim 1, wherein an even number of projection pieces are formed in the end face of the heat-sink plate.

3. An electronic component mounting base board according to claim 2, wherein the projection pieces are symmetrically arranged with respect to a center of the heat-sink plate.

4. An electronic component mounting base board according to claim 3, wherein the projection pieces are arranged in a position most apart from the central position of the heat-sink plate.

5. An electronic component mounting base board according to claim 1, wherein a length of the projection piece to be inserted into the inside of the ground hole is within a range of 50–100% of the depth of the grounding hole.

6. An electronic component mounting base board according to claim 1, wherein the inserting portion of the projection piece into the inside of the grounding hole is joined over 50–100% of a full surface of the inserting portion to the solder filled in the inside of the grounding hole.

7. An electronic component mounting base board according to claim 1, wherein the projection piece has a thickness of 0.1–0.5 mm.

8. An electronic component mounting base board according to claim 1, wherein the heat-sink plate has a thickness of 0.1–1.0 mm.

9. A method of producing an electronic component mounting base board provided with a grounding pattern, which comprises forming a mounting portion for mounting an electronic component, a wiring pattern for signal or power, a grounding pattern configured to surround the mounting portion and a grounding hole covered at its inner wall with a metal plated film on an insulating substrate, and adhering a heat-sink plate to a lower surface of the insulating substrate through an adhesion layer having an opening at a position corresponding to the grounding hole, and feeding a solder to an inside of the grounding hole, and fusing the solder by heating to join the metal plated film formed in the inner wall of the grounding hole to the heat-sink plate, wherein a projection piece extending from the end face of the heat-sink plate and folding therefrom is inserted into the inside of the grounding hole after the formation of the grounding hole and before the adhesion of the heat-sink plate to the lower surface of the insulating substrate.

10. The method according to claim 9, wherein a solder is simultaneously fed to the wiring pattern for signal or power in the feeding of the solder to the inside of the grounding hole.

11. The method according to claim 9, wherein a solder ball is dropped into the inside of the grounding hole in the feeding of the solder to the inside of the grounding hole.

12. The method according to claim 9, wherein a solder paste is printed in the feeding of the solder to the inside of the grounding hole.

* * * * *